(12) United States Patent
Kawasaki

(10) Patent No.: US 8,135,557 B2
(45) Date of Patent: Mar. 13, 2012

(54) APPARATUS FOR TESTING SEMICONDUCTOR INTEGRATED CIRCUIT AND METHOD FOR TESTING SEMICONDUCTOR INTEGRATED CIRCUIT

(75) Inventor: Yukio Kawasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 12/195,579

(22) Filed: Aug. 21, 2008

(65) Prior Publication Data
US 2009/0063086 A1 Mar. 5, 2009

(30) Foreign Application Priority Data
Aug. 30, 2007 (JP) .................................. 2007-223641

(51) Int. Cl.
*G01R 27/28* (2006.01)
(52) U.S. Cl. .......................... 702/117; 702/118; 702/125
(58) Field of Classification Search .......... 702/117–118, 702/182
See application file for complete search history.

(56) References Cited

U.S. PATENT DOCUMENTS

| | | | | |
|---|---|---|---|---|
| 5,097,468 A * | 3/1992 | Earlie | ............................... | 714/34 |
| 5,444,717 A * | 8/1995 | Rotker et al. | .................. | 714/744 |
| 5,650,938 A * | 7/1997 | Bootehsaz et al. | ................ | 716/6 |
| 6,088,821 A | 7/2000 | Moriguchi et al. | | |
| 6,487,704 B1 * | 11/2002 | McNamara et al. | .......... | 716/106 |
| 6,601,221 B1 | 7/2003 | Fairbanks | | |
| 2003/0115033 A1 * | 6/2003 | Aitken et al. | .................... | 703/14 |
| 2004/0073876 A1 | 4/2004 | Khalil et al. | | |
| 2005/0216247 A1 * | 9/2005 | Ikeda et al. | ...................... | 703/19 |
| 2008/0301509 A1 * | 12/2008 | Lai et al. | ....................... | 714/724 |

FOREIGN PATENT DOCUMENTS

| | | |
|---|---|---|
| JP | 2001-229211 | 8/2001 |
| JP | 2004-192334 | 7/2004 |
| JP | 2005-182093 | 7/2005 |

OTHER PUBLICATIONS

Japanese Office Action for 2007-223641 mailed on Feb. 16, 2010.

* cited by examiner

*Primary Examiner* — Drew A Dunn
*Assistant Examiner* — Mischita Henson
(74) *Attorney, Agent, or Firm* — Turocy & Watson, LLP

(57) ABSTRACT

An apparatus for testing a semiconductor integrated circuit includes an input part that inputs circuit description data that describes a circuit structure of the semiconductor integrated circuit, a clock domain of the semiconductor integrated circuit, and a first test vector to be used for testing a normal operation of the semiconductor integrated circuit, and a simulator that performs a simulation on the semiconductor integrated circuit with the use of a test vector. The simulator includes an asynchronous transfer point extraction unit that extracts an asynchronous transfer point in the semiconductor integrated circuit in accordance with the circuit description data and the clock domain that are input through the input part, a simulation unit that calculates a logic circuit output of the semiconductor integrated circuit by performing a simulation in accordance with the circuit description data and the first test vector that are input through the input part, and a second test vector generation unit that generates a second test vector by changing a signal of an asynchronous transfer point of the logic circuit output calculated by the simulation unit in accordance with the asynchronous transfer point extracted by the asynchronous transfer point extraction unit.

14 Claims, 15 Drawing Sheets

| ASYNC TRANSFER POINT | OUTPUT SIGNAL OF ASYNC TRANSFER POINT |
|---|---|
| FFA-FFC | sig_C |
| FFB-FFE | sig_E |

|      | t1 | t2 | t3 | t4 | t5 | t6 | t7 | t8 | ... |
|------|----|----|----|----|----|----|----|----|-----|
| CLK1 | 0  | 1  | 0  | 1  | 0  | 1  | 0  | 1  | ... |
| CLK2 | 0  | 0  | 1  | 1  | 0  | 0  | 1  | 1  | ... |
| sig_A | 0 | 0  | 0  | 1  | 1  | 1  | 1  | 1  | ... |
| sig_B | 0 | 0  | 0  | 1  | 1  | 1  | 1  | 1  | ... |
| sig_C | 0 | 0  | 0  | 0  | 1  | 1  | 1  | 1  | ... |
| sig_D | 0 | 0  | 1  | 1  | 1  | 1  | 1  | 1  | ... |
| sig_E | 0 | 0  | 0  | 0  | 0  | 1  | 1  | 1  | ... |

143

|       | t1 | t2 | t3 | t4 | t5 | t6 | t7 | t8 | ... |
|-------|----|----|----|----|----|----|----|----|-----|
| sig_D | 0  | 0  | 1  | 1  | 1  | 1  | 1  | 1  | ... |

| LOGIC CIRCUIT OUTPUT | t1 | t2 | t3 | t4 | t5 | t6 | t7 | t8 | .. |
|---|---|---|---|---|---|---|---|---|---|
| CLK1 | 0 | 1 | 0 | 1 | 0 | 1 | 0 | 1 | .. |
| CLK2 | 0 | 0 | 1 | 1 | 0 | 0 | 1 | 1 | .. |
| sig_A | 0 | 0 | 1 | 1 | 1 | 1 | 1 | 1 | .. |
| sig_B | 0 | 0 | 1 | 1 | 1 | 1 | 1 | 1 | .. |
| sig_C | 0 | 0 | 0 | 0 | 0 | 1 | 1 | 1 | .. |
| sig_D | 0 | 0 | 1 | 1 | 1 | 1 | 1 | 1 | .. |
| sig_E | 0 | 0 | 0 | 0 | 0 | 0 | 1 | 1 | .. |

| SIGNAL NAME | SIMULATION TIME | CHANGE |
|---|---|---|
| sig_C | t5 | 1→0 |
| sig_E | t6 | 1→0 |

FIG. 9

|       | t1 | t2 | t3 | t4 | t5 | t6 | t7 | t8 | ... |
|-------|----|----|----|----|----|----|----|----|-----|
| CLK1  | 0  | 1  | 0  | 1  | 0  | 1  | 0  | 1  | ... |
| CLK2  | 0  | 0  | 1  | 1  | 0  | 0  | 1  | 1  | ... |
| sig_A | 0  | 0  | 0  | 1  | 1  | 1  | 1  | 1  | ... |
| sig_B | 0  | 0  | 1  | 1  | 1  | 1  | 1  | 1  | ... |
| sig_C | 0  | 0  | 0  | 0  | 1  | 1  | 1  | 0  | ... |
| sig_D | 0  | 0  | 1  | 1  | 1  | 1  | 1  | 1  | ... |
| sig_E | 0  | 0  | 0  | 0  | 1  | 1  | 1  | 1  | ... |

FIG. 11

LOGIC CIRCUIT OUTPUT

| | t1 | t2 | t3 | t4 | t5 | t6 | t7 | t8 | ... |
|---|---|---|---|---|---|---|---|---|---|
| CLK1 | 0 | 1 | 0 | 1 | 0 | 1 | 0 | 1 | .. |
| CLK2 | 0 | 0 | 1 | 1 | 0 | 0 | 1 | 1 | .. |
| sig_A | 0 | 0 | 0 | 1 | 0 | 1 | 1 | 1 | .. |
| sig_B | 0 | 0 | 1 | 1 | 1 | 1 | 1 | 1 | .. |
| sig_C | 0 | 0 | 0 | 0 | 0 | 1 | 1 | 0 | .. |
| sig_D | 0 | 0 | 1 | 1 | 1 | 1 | 1 | 1 | .. |
| sig_E | 0 | 0 | 0 | 0 | 0 | 1 | 1 | 1 | .. |

| SIGNAL NAME | SIMULATION TIME | CHANGE |
|---|---|---|
| sig_C | t5 | 1→0 |
| sig_E | | 1→0 |
| sig_C | t7 | 0→1 |

|       | t1 | t2 | t3 | t4 | t5 | t6 | t7 | t8 | ... |
|-------|----|----|----|----|----|----|----|----|-----|
| CLK1  | 0  | 1  | 0  | 1  | 0  | 1  | 0  | 1  | ... |
| CLK2  | 0  | 0  | 1  | 1  | 0  | 0  | 1  | 1  | ... |
| sig_A | 0  | 0  | 0  | 1  | 1  | 1  | 1  | 1  | ... |
| sig_B | 0  | 0  | 1  | 1  | 1  | 1  | 1  | 1  | ... |
| sig_C | 0  | 0  | 0  | 0  | 0  | 0  | 0  | 0  | ... |
| sig_D | 0  | 0  | 1  | 1  | 1  | 1  | 1  | 1  | ... |
| sig_E | 0  | 0  | 0  | 0  | 1  | 1  | 1  | 1  | ... |

LOGIC CIRCUIT OUTPUT

| | t1 | t2 | t3 | t4 | t5 | t6 | t7 | t8 | ⋮ |
|---|---|---|---|---|---|---|---|---|---|
| CLK1 | 0 | 1 | 0 | 1 | 0 | 1 | 0 | 1 | ⋮ |
| CLK2 | 0 | 0 | 1 | 1 | 0 | 0 | 1 | 1 | ⋮ |
| sig_A | 0 | 0 | 1 | 1 | 1 | 1 | 1 | 1 | ⋮ |
| sig_B | 0 | 0 | 0 | 1 | 1 | 1 | 1 | 1 | ⋮ |
| sig_C | 0 | 0 | 0 | 0 | 0 | 1 | 1 | 0 | ⋮ |
| sig_D | 0 | 0 | 1 | 1 | 1 | 1 | 1 | 1 | ⋮ |
| sig_E | 0 | 0 | 0 | 0 | 0 | 0 | 1 | 1 | ⋮ |

346

| SIGNAL NAME | SIMULATION TIME | CHANGE |
|---|---|---|
| sig_C | t6→t7 | 1→0 |
| sig_E | t6 | 1→0 |

FIG. 16

APPARATUS FOR TESTING SEMICONDUCTOR INTEGRATED CIRCUIT AND METHOD FOR TESTING SEMICONDUCTOR INTEGRATED CIRCUIT

CROSS-REFERENCE TO RELATED APPLICATION

This application is based upon and claims the benefit of priority from the prior Japanese Patent Application No. 2007-223641, filed on Aug. 30, 2007; the entire contents of which are incorporated herein by reference.

BACKGROUND OF THE INVENTION

1. Field of the Invention

The present invention relates to an apparatus for testing a semiconductor integrated circuit and a method for testing the semiconductor integrated circuit, and more particularly, to an apparatus for testing a semiconductor integrated circuit that includes a plurality of semiconductor elements operating in an asynchronous manner, and a method for testing the semiconductor integrated circuit.

2. Related Art

Testing a semiconductor integrated circuit that includes resisters asynchronously operating with clocks of different frequencies and involves data transfers between a plurality of semiconductor elements is carried out by performing a simulation with the use of test vectors that are created by an engineer. Japanese Patent Application Laid-Open Publication No. 2005-182093 discloses one of those conventional testing methods.

In recent years, however, the number of clocks has increased in SoC designs, and the designs have become complicated. Therefore, the number of points at which asynchronous transfers occur (hereinafter referred to as the "asynchronous transfer points") has increased, and the number of subject points and items to be tested has also increased. As a result, a large amount of work time is imposed on each engineer to create test vectors.

In testing a semiconductor integrated circuit that has transfer errors such as asynchronous transfers, it is necessary to carry out a test on a violation equivalent to a transfer error due to metastability, as well as a test on a simple normal operation.

To reproduce such a violation with test vectors, it is necessary to accurately grasp the timing in the semiconductor integrated circuit, and consider various combinations of clock timings provided in the test vectors and transfer data. As a result, the work time imposed on each engineer to create test vectors has been increasing.

SUMMARY OF THE INVENTION

According to a first aspect of the present invention, there is provided that an apparatus for testing a semiconductor integrated circuit, comprising:
an input part that inputs circuit description data that describes a circuit structure of the semiconductor integrated circuit, a clock domain of the semiconductor integrated circuit, and a first test vector to be used for testing a normal operation of the semiconductor integrated circuit; and
a simulator that performs a simulation on the semiconductor integrated circuit with the use of a test vector;
wherein the simulator including an asynchronous transfer point extraction unit that extracts an asynchronous transfer point in the semiconductor integrated circuit in accordance with the circuit description data and the clock domain that are input through the input part;
a simulation unit that calculates a logic circuit output of the semiconductor integrated circuit by performing a simulation in accordance with the circuit description data and the first test vector that are input through the input part; and
a second test vector generation unit that generates a second test vector by changing a signal of an asynchronous transfer point of the logic circuit output calculated by the simulation unit in accordance with the asynchronous transfer point extracted by the asynchronous transfer point extraction unit.

According to a second aspect of the present invention, there is provided that a method for testing a semiconductor integrated circuit, comprising:
inputting circuit description data that describes a circuit structure of the semiconductor integrated circuit, a clock domain of the semiconductor integrated circuit, and a first test vector to be used for testing a normal operation of the semiconductor integrated circuit;
extracting an asynchronous transfer point of the semiconductor integrated circuit, in accordance with the circuit description data and clock domain;
calculating a logic circuit output of the semiconductor integrated circuit by performing a simulation in accordance with the input circuit description data and first test vector; and
generating a second test vector by changing a signal of an asynchronous transfer point of the logic circuit output calculated by the simulation unit in accordance with the extracted asynchronous transfer point.

BRIEF DESCRIPTION OF THE DRAWINGS

FIG. 7 is a table showing the logic circuit output data 143 and the first external output data 144 in accordance with the first embodiment of the present invention.

FIG. 9 is a table showing the change data 146 in accordance with the first embodiment of the present invention.

FIG. 11 is a table showing the logic circuit output data 243 in accordance with the first embodiment of the present invention.

FIG. 13 is a table showing the logic circuit output and the change data 246 in accordance with the second embodiment of the present invention.

FIG. 14 is a table showing the logic circuit output data 343 in accordance with the third embodiment of the present invention.

FIG. 16 is a table showing the logic circuit outputs and change data 346 in accordance with the third embodiment of the present invention.

DETAILED DESCRIPTION OF THE INVENTION

The following is a description of embodiments of the present invention, with reference to the accompanying drawings. It should be noted that the following embodiments are merely examples and do not limit the scope of the present invention.

First Embodiment

First, a first embodiment of the present invention is described.

Figure 1:
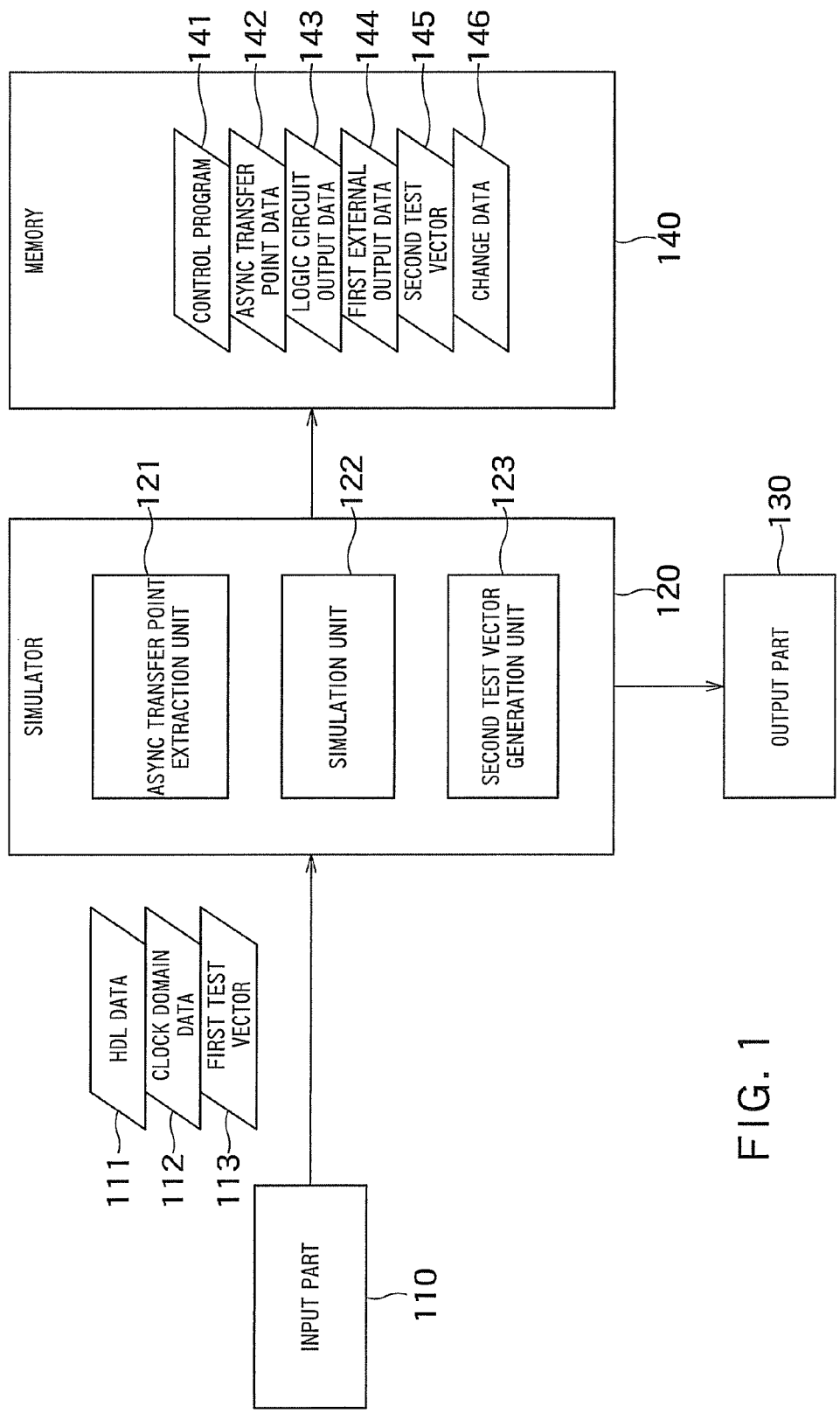
FIG. 1 is a block diagram showing the structure of a testing apparatus in accordance with the first embodiment of the present invention.

FIG. 1 is a block diagram showing the structure of a testing apparatus in accordance with the first embodiment of the present invention.

The testing apparatus in accordance with the first embodiment of the present invention includes an input part 110, a simulator 120, an output part 130, and a memory 140.

The input part 110 inputs a circuit description data (for example, hardware description language data written in Verilog language at register transfer level, and hereinafter referred to as the "HDL data") 111 that indicates the semiconductor integrated circuit to be tested, clock domain data 112 that indicates the terminal name (hereinafter referred to as the "clock domain") of an external clock terminal that supplies an operation clock to a flip-flop of the semiconductor integrated circuit described in the HDL data 111, and a first test vector 113 to be used in a simulation (hereinafter referred to as the "first simulation") of an operation (hereinafter referred to as the "normal operation") to be performed in a case where the FF of the semiconductor integrated circuit described in the HDL data 111 performs a synchronous transfer. For example, the input part 110 is a keyboard or a mouse. The HDL data 111, the clock domain data 112, and the first test vector 113 are input by a user through the input part 110.

The clock domain data 112 may indicate the same clock domain with respect to more than one external clock terminal.

The simulator 120 runs a control program 141 stored in the memory 140, so as to realize an asynchronous transfer point extraction unit 121, a simulation unit 122, and a second test vector generation unit 123.

The asynchronous transfer point extraction unit 121 carries out an asynchronous transfer point extraction process. In the asynchronous transfer point extraction process, the asynchronous transfer point extraction unit 121 refers to the HDL data 111 and the clock domain data 112, so as to extract the interelement connection between elements in the semiconductor integrated circuit that perform asynchronous transfers to each other (the interelement connection will be hereinafter referred to as the "asynchronous transfer point"). The asynchronous transfer point extraction unit 121 then generates asynchronous transfer point data 142, and writes the asynchronous transfer point data 142 into the memory 140.

The simulation unit 122 performs the first simulation. In the first simulation, the simulation unit 122 calculates a logic circuit output and a first external output of the semiconductor integrated circuit by performing a simulation on the semiconductor integrated circuit described in the HDL data 111 with the use of the first test vector 113. The simulation unit 122 then generates logic circuit output data 143 and first external output data 144, and writes the logic circuit output data 143 and the first external output data 144 into the memory 140. The simulation unit 122 transmits the simulation results to the output part 130.

The simulation unit 122 also performs a second simulation. In the second simulation, the simulation unit 122 calculates a second external output of the semiconductor integrated circuit by performing a simulation on the semiconductor integrated circuit described in the HDL data 111 with the use of a second test vector 145. The simulation unit 122 then transmits the simulation result to the output part 130.

The second test vector generation unit 123 carries out a test vector generation process. In the test vector generation process, the second test vector generation unit 123 generates the second test vector 145 and change data 146 in accordance with the asynchronous transfer point data 142 and the logic circuit output data 143, and writes the second test vector 145 and the change data 146 into the memory 140. The change data 146 includes the name of a signal having the asynchronous transfer point inserted thereinto, the simulation time, and the contents of the change.

The output part 130 is a display that displays the data that is transmitted from the simulator 120.

The memory 140 stores the control program 141, the asynchronous transfer point data 142, the logic circuit output data 143, the first external output data 144, the second test vector 145, and the change data 146.

Figure 2:
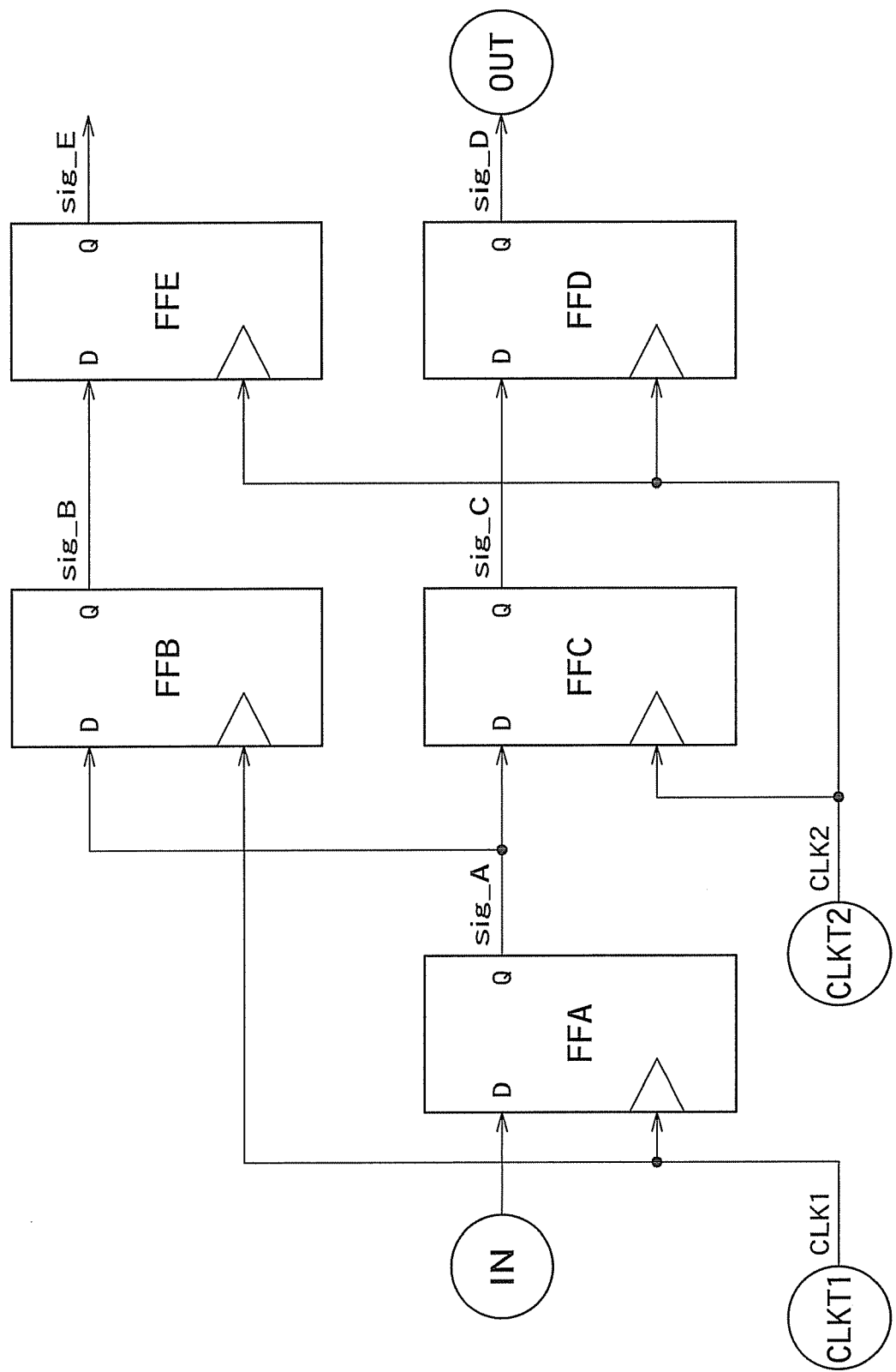
FIG. 2 is a circuit diagram showing an example structure of the semiconductor integrated circuit described in the HDL data 111 in accordance with the first embodiment of the present invention.

FIG. 2 is a circuit diagram showing an example structure of the semiconductor integrated circuit described in the HDL data 111 in accordance with the first embodiment of the present invention.

The HDL data 111 in accordance with the first embodiment of the present invention includes an input terminal IN, an output terminal OUT, a first external clock terminal CLKT1, a second external clock terminal CLKT2, and flip-flops FFA to FFD.

The D-terminal of the flip-flop FFA is connected to the input terminal IN, and the Q-terminal of the flip-flop FFA is connected to the D-terminals of the flip-flops FFB and FFC. The flip-flop FFA transfers an output signal sig_A when a first clock CLK1 is supplied as an operation clock from the first external clock terminal CLKT1.

The D-terminal of the flip-flop FFB is connected to the Q-terminal of the flip-flop FFA, and the Q-terminal of the flip-flop FFB is connected to the D-terminal of the flip-flop FFE. The flip-flop FFB transfers an output signal sig_B when the first clock CLK1 is supplied as an operation clock from the first external clock terminal CLKT1.

The D-terminal of the flip-flop FFC is connected to the Q-terminal of the flip-flop FFA, and the Q-terminal of the flip-flop FFC is connected to the D-terminal of the flip-flop FFD. The flip-flop FFC transfers an output signal sig_C when a second clock CLK2 is supplied as an operation clock from the second external clock terminal CLKT2.

The D-terminal of the flip-flop FFD is connected to the Q-terminal of the flip-flop FFC, and the Q-terminal of the flip-flop FFD is connected to the output terminal OUT. The flip-flop FFD transfers an output signal sig_D when the second clock CLK2 is supplied as an operation clock from the second external clock terminal CLKT2.

The D-terminal of the flip-flop FFE is connected to the Q-terminal of the flip-flop FFB, and the Q-terminal of the flip-flop FFE is connected to a semiconductor element (not shown). The flip-flop FFE transfers an output signal sig_E when the second clock CLK2 is supplied as an operation clock from the second external clock terminal CLKT2.

In the semiconductor integrated circuit shown in FIG. 2, the signal that is transmitted from the input terminal IN to the D-terminal of the flip-flop FFA is a logic circuit input, and the output signal sig_D transferred from the flip-flop FFD to the output terminal OUT is a logic circuit output.

Figure 3:
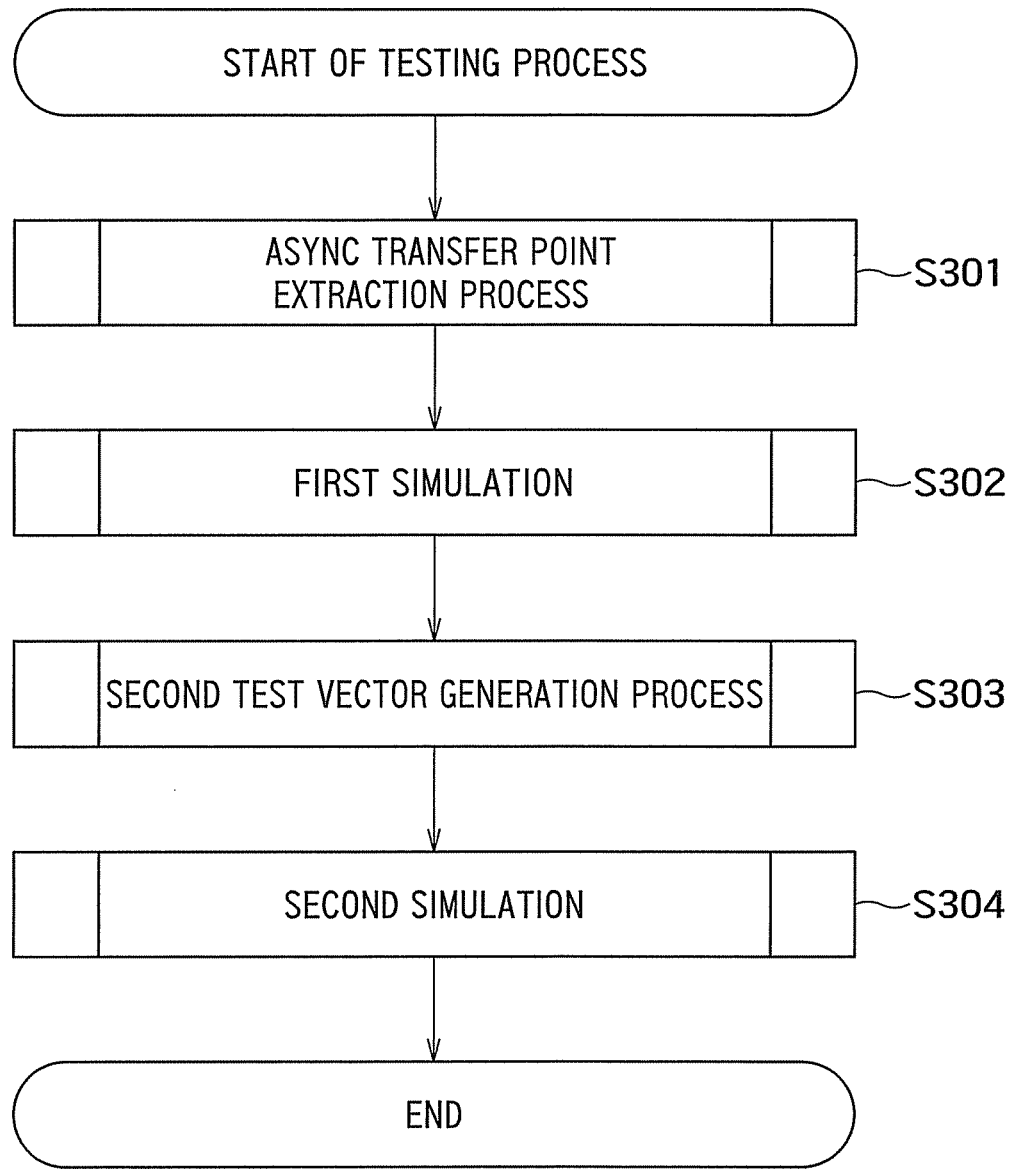
FIG. 3 is a flowchart showing the operation procedures to be carried out by the simulator 120 in a testing process in accordance with the first embodiment of the present invention.

FIG. 3 is a flowchart showing the operation procedures to be carried out by the simulator 120 in a testing process in accordance with the first embodiment of the present invention.

The testing process in accordance with the first embodiment of the present invention includes the asynchronous transfer point extraction process (S301) to be carried out by the asynchronous transfer point extraction unit 121, the first simulation (S302) to be performed by the simulation unit 122, the second test vector generation process (S303) to be carried out by the second test vector generation unit 123, and the second simulation (S304) to be performed by the simulation unit 122. Those processes are carried out in that order.

Figure 4:
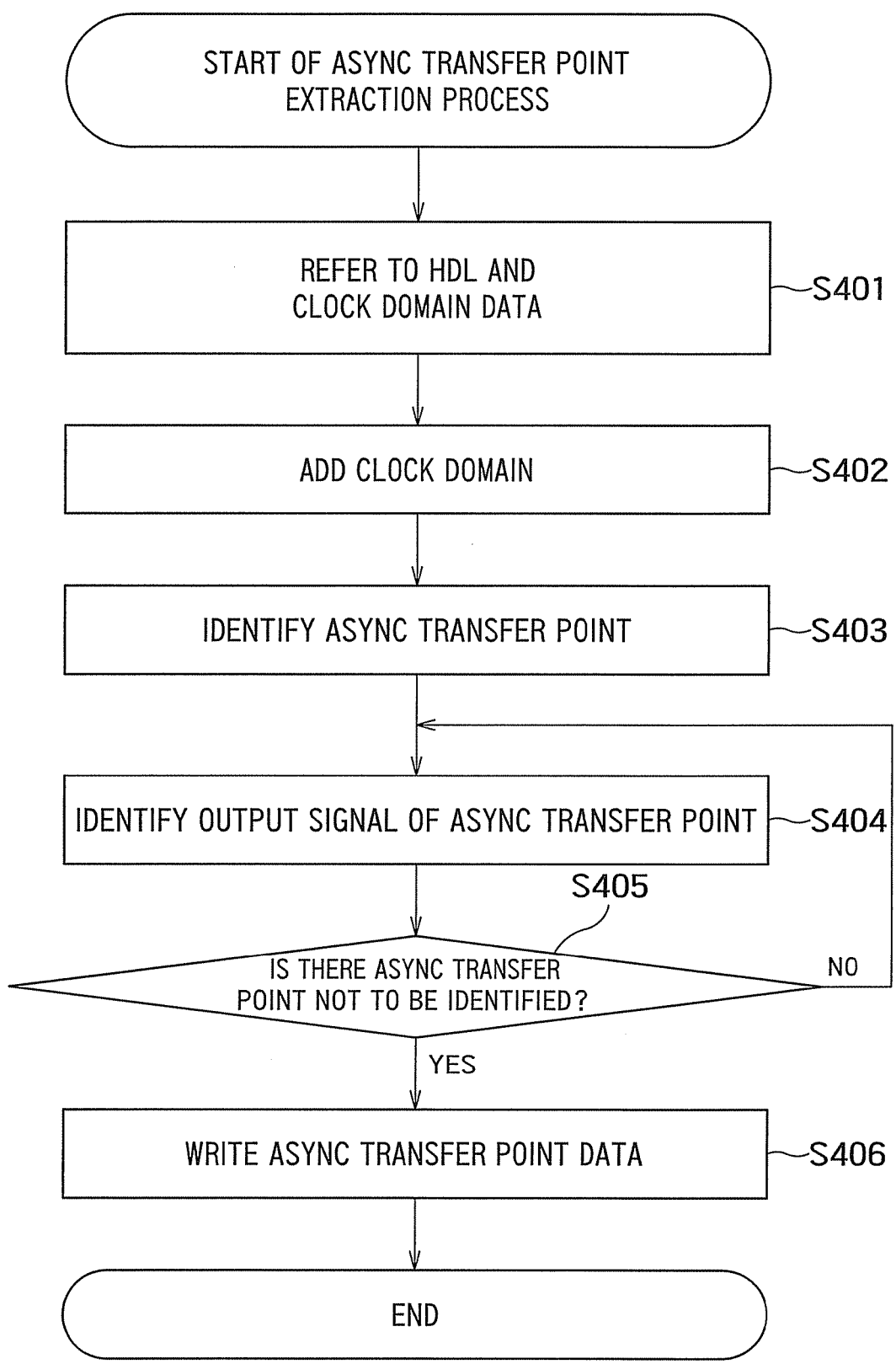
FIG. 4 is a flowchart showing the operation procedures to be carried out by the asynchronous transfer point extraction unit 121 in the asynchronous transfer point extraction process in accordance with the first embodiment of the present invention.

FIG. 4 is a flowchart showing the operation procedures to be carried out by the asynchronous transfer point extraction unit 121 in the asynchronous transfer point extraction process in accordance with the first embodiment of the present invention.

First, the asynchronous transfer point extraction unit 121 refers to the HDL data 111 and the clock domain data 112 that are input through the input part 110 (S401).

The asynchronous transfer point extraction unit 121 then traces back to an external clock terminal from the clock terminal of each flip-flop of the semiconductor integrated circuit described in the HDL data 111 that is referred to in step S401, and adds the clock domain described in the clock domain data 112 to the external clock terminal tracked as an end terminal (S402). In the example structure shown in FIG. 2, CLKT1 is added as the clock domain to each clock terminal of the flip-flops FFA and FFB, and CLKT2 is added as the clock domain to each clock terminal of the flip-flops FFC to FFE. As a result, the clock CLK1 is identified as the operation clock for the flip-flops FFA and FFB, and the clock CLK2 is identified as the operation clock for the flip-flops FFC to FFE.

The asynchronous transfer point extraction unit 121 then identifies an asynchronous transfer point to be an interelement connection formed by a pair of flip-flops having different clock domains added thereto in step S402, among the interelement connections in the semiconductor integrated circuit described in the HDL data 111 that is referred to in step S401 (S403). In the example structure shown in FIG. 2, the interelement connection formed by the pair of flip-flops FFA and FFC and the interelement connection formed by the pair of flip-flops FFB and FFE are identified as asynchronous transfer points.

The asynchronous transfer point extraction unit 121 then identifies output signals of the asynchronous transfer points identified in step S403 (S404). In the example structure shown in FIG. 2, the output signal sig_C transferred from the Q-terminal of the flop-flop FFC to the D-terminal of the flip-flop FFD, and the output signal sig_E transferred from the Q-terminal of the flip-flop FFE to the semiconductor element (not shown) are identified as the output signals that might become errors in a violation due to metastability.

The procedure of step S404 is repeated until the output signals of all the asynchronous transfer points identified in step S403 are identified (S405—NO).

If the output signals of all the asynchronous transfer points identified in step S403 are identified (S405—YES), the asynchronous transfer point extraction unit 121 writes the asynchronous transfer points identified in step S403 and the output signals identified in step S404 as the asynchronous transfer point data 142 into the memory 140 (S406). In the example structure shown in FIG. 2, the asynchronous transfer point data 142 shown in FIG. 5 is written into the memory 140.

After the procedure of step S406 is carried out, the asynchronous transfer point extraction process in accordance with the first embodiment of the present invention is completed.

Figures 5, 6:
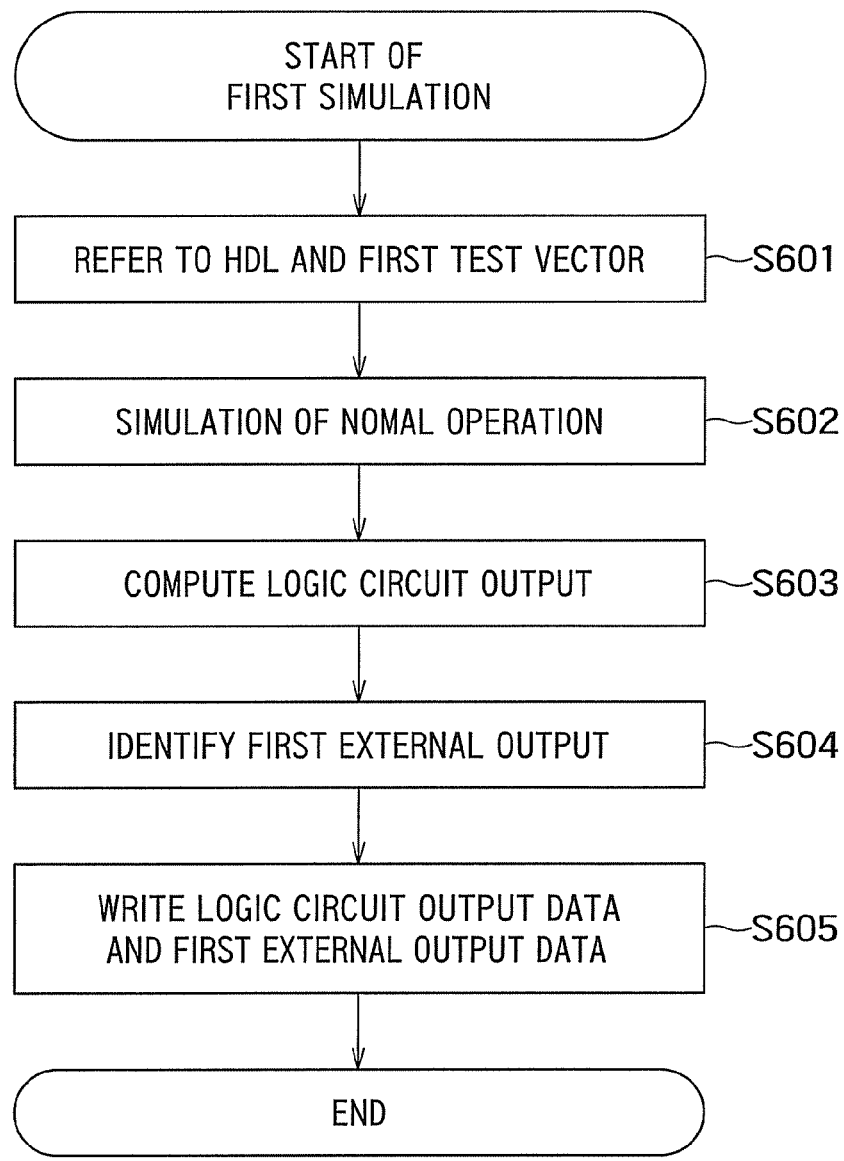
FIG. 5 is a table showing the asynchronous transfer point data 142 in accordance with the first embodiment of the present invention.
FIG. 6 is a flowchart showing the operation procedures to be carried out by the simulation unit 122 in the first simulation in accordance with the first embodiment of the present invention.

FIG. 6 is a flowchart showing the operation procedures to be carried out by the simulation unit 122 in the first simulation in accordance with the first embodiment of the present invention.

First, the simulation unit 122 refers to the HDL data 111 and the first test vector 113 that are input through the input part 110 (S601).

The simulation unit 122 then performs a simulation of a normal operation of the semiconductor integrated circuit described in the HDL data 111 with the use of the first test vector 113 that is referred to in step S601 (S602). In step S602, the simulation unit 122 uses a Value Change Dump function.

The simulation unit 122 then calculates the logic circuit output for each flop-flop in a normal operation of the semiconductor integrated circuit described in the HDL data 111 that is referred to in step S601 (S603). In the example structure shown in FIG. 2, the values of the output signals sig_A to sig_E of the flop-flops FFA to FFE are calculated as the logic circuit outputs.

The simulation unit 122 then identifies the first external output to be the logic circuit output transferred to an external output terminal among the logic circuit outputs calculated in step S603 (S604). In the example structure shown in FIG. 2, the value of the output signal sig_C of the flip-flop FFC is identified as the first external output.

The simulation unit 122 then writes the logic circuit outputs identified in step S603 as the logic circuit output data 143 into the memory 140, and writes the first external output identified in step S604 as the first external output data 144 into the memory 140 (S605). In the example structure shown in FIG. 2, the logic circuit output data 143 and the first external output data 144 shown in FIG. 7 are written into the memory 140.

After the procedure of step S605 is carried out, the first simulation in accordance with the first embodiment of the present invention is completed.

Figure 8:
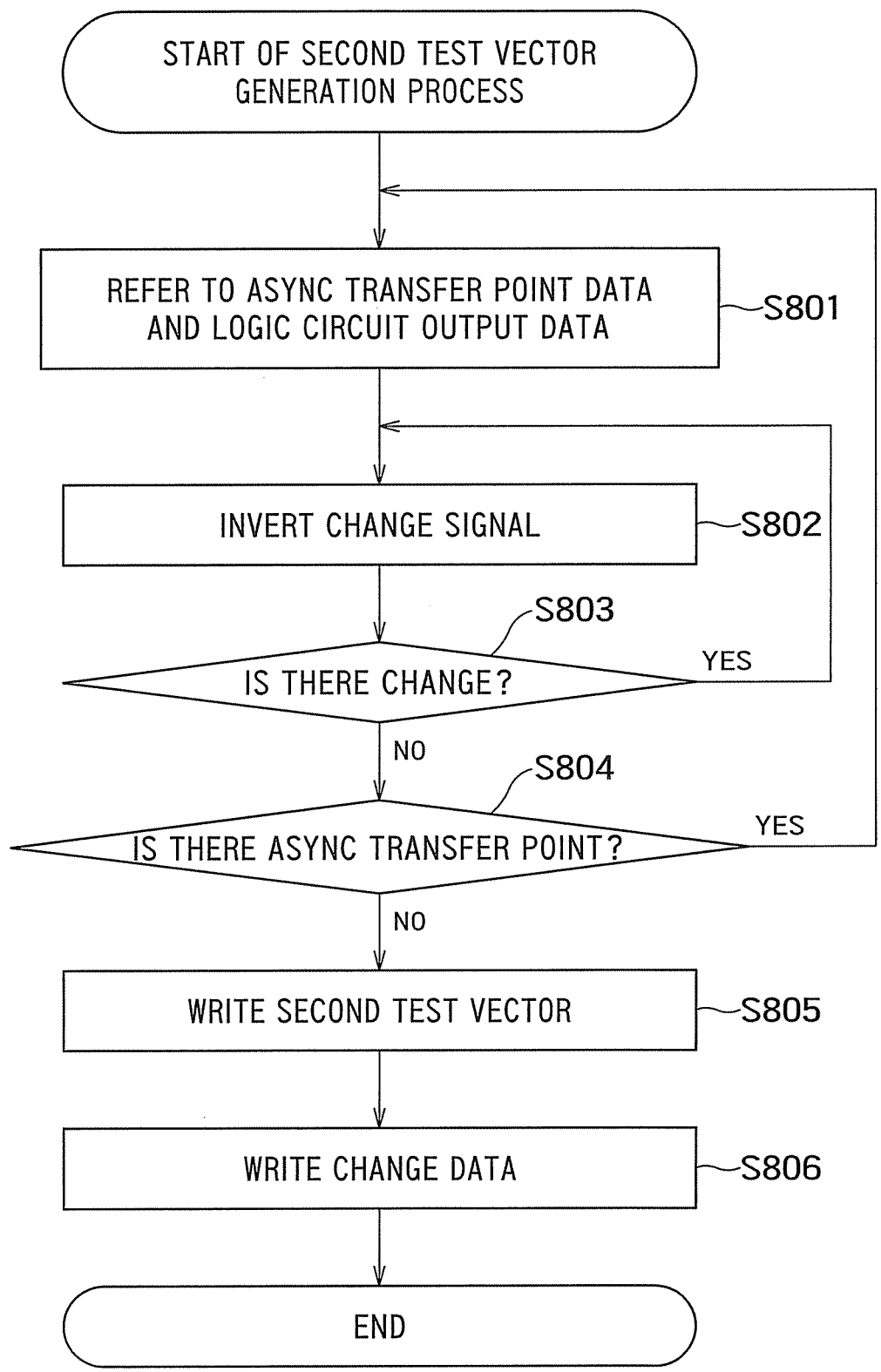
FIG. 8 is a flowchart showing the operation procedures to be performed by the second test vector generation unit 123 in the second test vector generation process in accordance with the first embodiment of the present invention.

FIG. 8 is a flowchart showing the operation procedures to be performed by the second test vector generation unit 123 in the second test vector generation process in accordance with the first embodiment of the present invention.

First, the second test vector generation unit 123 refers to the asynchronous transfer point data 142 and the logic circuit output data 143 stored in the memory 140 (S801).

The second test vector generation unit 123 then traces the state of the signal of the asynchronous transfer point in the logic circuit output data 143 that is referred to in step S801, identifies the change point of the signal, and inverts the signal at the change point, so as to modify the logic circuit outputs (S802). In the example shown in FIG. 7, the signals sig_C (t5) and sig_E (t6) are the signals at the change points, so each of those signals is inverted from "1" to "0". As a result, the logic circuit outputs shown in FIG. 9 are generated. In the example shown in FIG. 9, the signals sig_C (t5) and sig_E (t6) cannot be changed, or data cannot be transferred correctly at t5 and t6.

The procedure of step S802 is repeated until all the change points are subjected to this procedure (S803—YES). After all the change points are subjected to the procedure of step S802 (S803—NO), the procedures of S801 to S803 are repeated for all the asynchronous transfer points (S804—YES). After carrying out the procedures of steps S801 to S803 for all the asynchronous transfer points (S804—NO), the second test vector generation unit 123 writes the logic circuit outputs shown in FIG. 9 as the second test vector 145 into the memory 140 (S805).

The second test vector generation unit 123 then generates the change data 146 as shown in FIG. 9, and writes the change data 146 into the memory 140 (S806).

After the procedure of step S806 is carried out, the second test vector generation process in accordance with the first embodiment of the present invention is completed.

Figure 10:
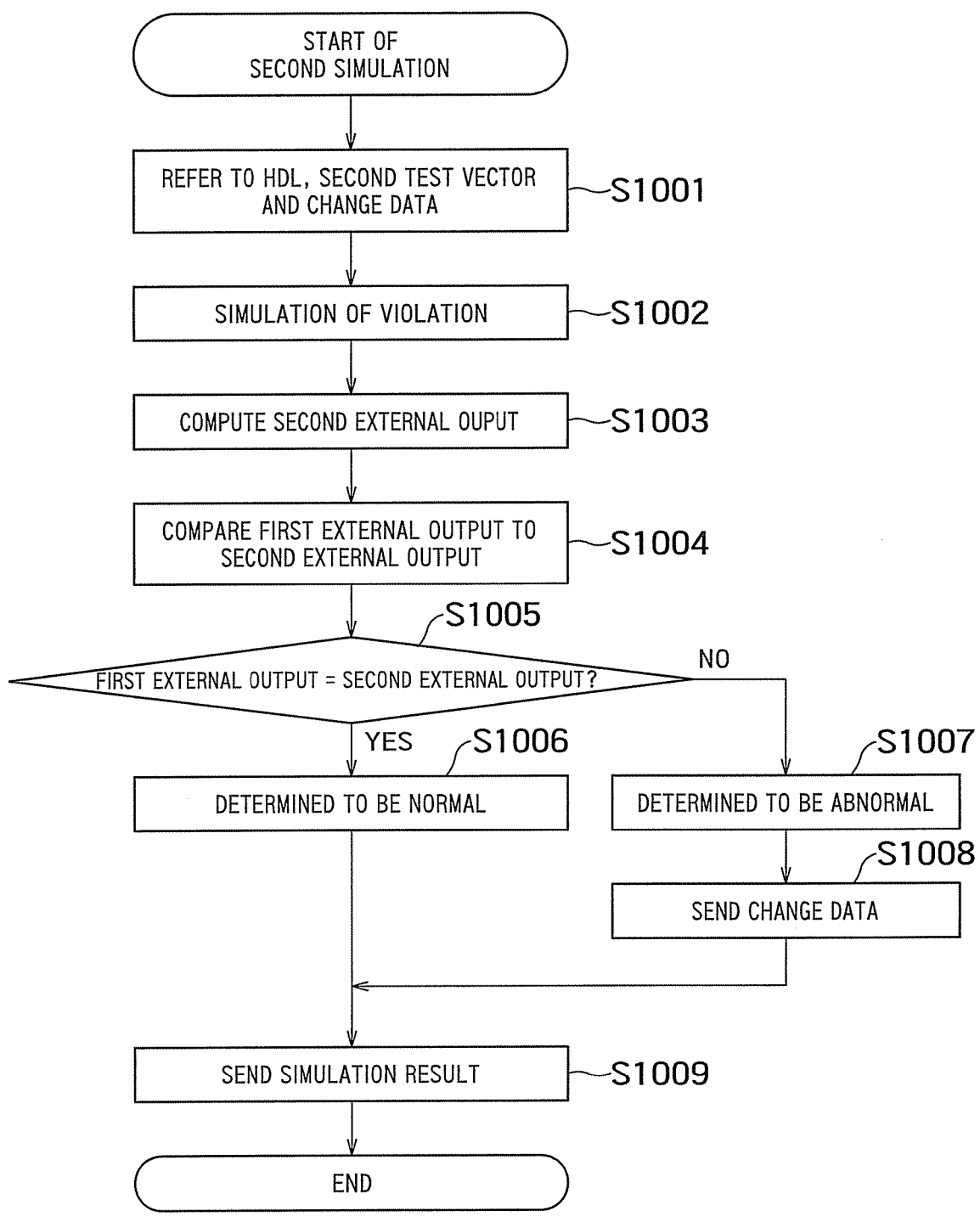
FIG. 10 is a flowchart showing the operation procedures to be carried out by the simulation unit 122 in the second simulation in accordance with the first embodiment of the present invention.

FIG. 10 is a flowchart showing the operation procedures to be carried out by the simulation unit 122 in the second simulation in accordance with the first embodiment of the present invention.

First, the simulation unit 122 refers to the HDL data 111 input through the input part 110, and the second test vector 145 and the change data 146 stored in the memory 140 (S1001).

The simulation unit 122 then performs a simulation of a violation of the semiconductor integrated circuit described in the HDL data 111 at the simulation time according to the change data 146, with the use of the second test vector 145 that is referred to in step S1001 (S1002). In the example structure shown in FIG. 2, a simulation of the signal sig_C is started at the simulation time t5 in the change data 146 shown in FIG. 9, and a simulation of the signal sig_E is started at the simulation time t6.

The simulation unit 122 then calculates an external output (hereinafter referred to as the "second external output") in the violation of the semiconductor integrated circuit described in the HDL data 111 that is referred to in step S1001 (S1003). In the example structure shown in FIG. 2, the value of the output signal sig_C of the flip-flop FFC obtained when the second test vector 145 shown in FIG. 9 is used is calculated as the second external output.

The simulation unit 122 then refers to the first external output data 144 stored in the memory 140, and compares the first external outputs with the second external outputs (S1004).

If the first external outputs and the second external outputs are the same (S1005—YES), the semiconductor integrated circuit described in the HDL data 111 that is referred to in step S1001 is determined to function properly even in a violation (S1006).

If the first external outputs are not the same as the second external outputs (S1005—NO), the semiconductor integrated circuit described in the HDL data 111 that is referred to in step S1001 is determined to function abnormally in a violation (S1007). The simulation unit 122 then transmits the change data 146 stored in the memory 140 to the output part 130 (S1008).

After carrying out the procedure of step S1006 or S1007 and the procedure of step S1008, the simulation unit 122 transmits the determination result of step S1006 or S1007 as the simulation result to the output part 130 (S1009).

After the procedure of step S1009 is carried out, the second simulation in accordance with the first embodiment of the present invention is completed.

In accordance with the first embodiment of the present invention, the asynchronous transfer point data 142 is generated, and the second test vector 145 for testing a violation is generated in accordance with the asynchronous transfer point data 142. Accordingly, it is possible to shorten the work time to be imposed on the engineer to create the test vectors for testing a violation of a semiconductor integrated circuit having asynchronous transfer points.

Also, in the first embodiment of the present invention, the second simulation is started at the simulation time of the change data 146. Accordingly, the operation time required for the second simulation can be shortened.

Also, in the first embodiment of the present invention, the change data 146 generated together with the second test vector 145 is output to the output part 130. Accordingly, when a semiconductor integrated circuit has a violation, specific information about the violation can be provided to the engineer.

Second Embodiment

Next, a second embodiment of the present invention is described. While the first embodiment of the present invention is a structure that generates a second test vector for each asynchronous transfer point, the second embodiment of the present invention is a structure that generates second test vectors for a plurality of asynchronous transfer points at the same time. Explanation of the aspects of the second embodiment of the present invention that are the same as those of the first embodiment of the present invention is not repeated here.

The testing apparatus in accordance with the second embodiment of the present invention includes an input part 210, a simulator 220, an output part 230, and a memory 240. Those components are the same as those of the first embodiment of the present invention.

In the second embodiment of the present invention, the logic circuit output data 243 shown in FIG. 11 is stored in the memory 240.

Figure 12:
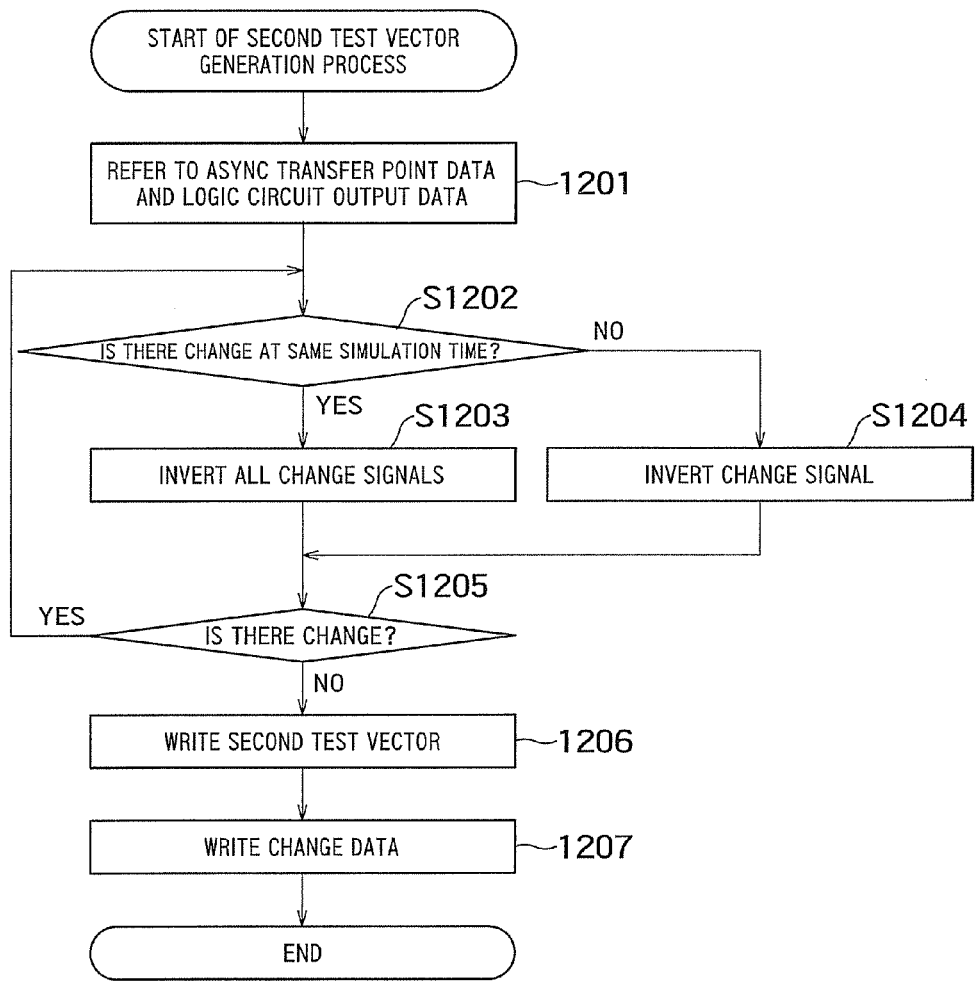
FIG. 12 is a flowchart showing the operation procedures to be carried out by a second test vector generation unit 223 in a second test vector generation process in accordance with the second embodiment of the present invention.

FIG. 12 is a flowchart showing the operation procedures to be carried out by a second test vector generation unit 223 in a second test vector generation process in accordance with the second embodiment of the present invention.

First, the second test vector generation unit 223 refers to asynchronous transfer point data 242 and the logic circuit output data 243 stored in the memory 240 (S1201).

The second test vector generation unit 223 then traces the state of the signal of the asynchronous transfer point of the logic circuit output data 243 that is referred to in step S1201, and identifies the change point of the signal. If a change point of a signal of another asynchronous transfer point exists at the same simulation time as the change point of the above signal (S1202—YES), the second test vector generation unit 223 inverts the change points of the signals of all the asynchronous transfer points, so as to modify the logic circuit outputs (S1203). In the example shown in FIG. 11, the signals sig_C (t5) and sig_E (t5) are the signals at the change point, so those signals are simultaneously inverted from "1" to "0". As a result, the logic circuit outputs shown in FIG. 13 are generated. In the example shown in FIG. 13, the signals sig_C (t5) and sig_E (t5) cannot be changed, or data cannot be transferred correctly at t5.

If a change point of a signal of another asynchronous transfer point does not exist at the same simulation time as the change point of the above signal (S1202—NO), the second test vector generation unit 223 inverts only the change point of the signal of the asynchronous transfer point of the logic circuit output data 243 that is referred to in step S1201, so as to modify the logic circuit outputs in the same manner as in the first embodiment of the present invention (S1204). In the example shown in FIG. 11, the signal sig_C (t7) is the signal at the change point, so the signal is inverted from "0" to "1". As a result, the logic circuit outputs shown in FIG. 13 are generated. In the example shown in FIG. 13, the signal sig_C (t7) cannot be changed, or data cannot be transferred correctly at t7.

The procedures of steps S1202 to S1204 are repeated until all the change points are subjected to those procedures (S1205—YES). After all the change points are subjected to the procedures of steps S1202 to S1204 (S1205—NO), the second test vector generation unit 223 writes the logic circuit outputs shown in FIG. 13 as the second test vectors 245 into the memory 240 (S1206).

The second test vector generation unit 223 then generates the change data 246 shown in FIG. 13, and writes the change data 246 into the memory 240 (S1207).

After the procedure of step S1207 is carried out, the second test vector generation process in accordance with the second embodiment of the present invention is completed.

In accordance with the second embodiment of the present invention, if the change points of signals of a plurality of asynchronous transfer points exist within the same simulation time, the signals at all the change points are inverted at the same time. Accordingly, even if a more complicated operation than in the first embodiment of the present invention is performed to generate test vectors, the work time to be imposed on the engineer can be shortened.

Third Embodiment

Next, a third embodiment of the present invention is described. While the first embodiment of the present invention is a structure that generates a second test vector if a change point at which the signal of an asynchronous transfer point varies exists within a predetermined simulation time, the third embodiment of the present invention is a structure that generates a second test vector if a change point does not exist within the predetermined simulation time. Explanation of the aspects of the third embodiment that are the same as those of the first and second embodiments of the present invention is not repeated here.

The testing apparatus in accordance with the third embodiment of the present invention includes an input part 310, a simulator 320, an output part 330, and a memory 340. Those components are the same as those of the first embodiment of the present invention.

In the third embodiment of the present invention, the logic circuit output data 343 shown in FIG. 14 is stored in the memory 340.

Figure 15:
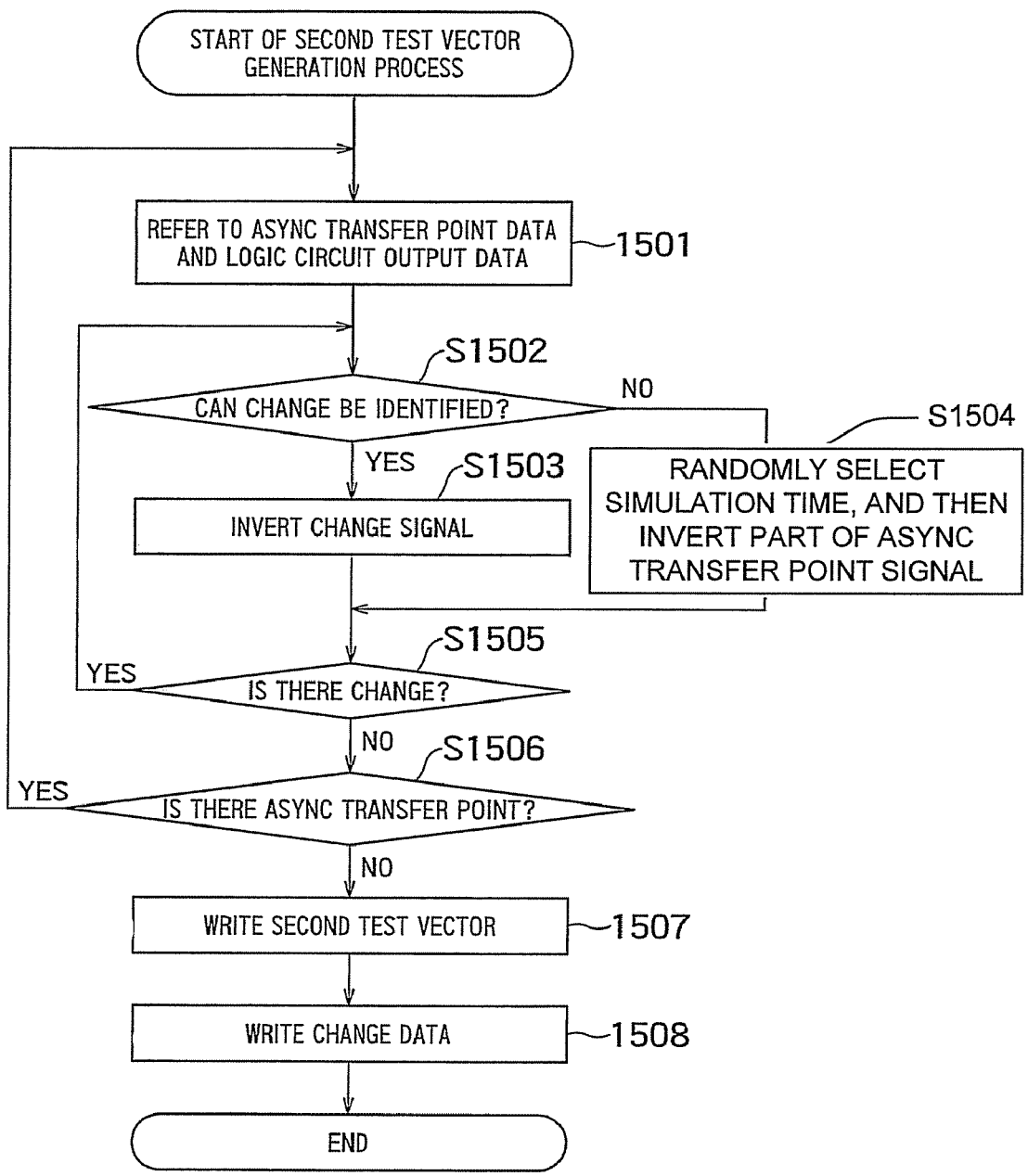
FIG. 15 is a flowchart showing the operation procedures to be carried out by a second test vector generation unit 323 in a second test vector generation process in accordance with the third embodiment of the present invention.

FIG. 15 is a flowchart showing the operation procedures to be carried out by a second test vector generation unit 323 in a second test vector generation process in accordance with the third embodiment of the present invention.

First, the second test vector generation unit 323 refers to asynchronous transfer point data 342 and the logic circuit output data 343 stored in the memory 340 (S1501).

The second test vector generation unit 323 then traces the state of the signal of the asynchronous transfer point of the logic circuit output data 343 that is referred to in step S1501. When a change point of a signal is identified (S1502—YES), the second test vector generation unit 323 inverts the change point of the signal of the asynchronous transfer point of the logic circuit output data 343 that is referred to in step S1501, so as to modify the logic circuit outputs in the same manner as in the first embodiment of the present invention (S1503). In the example shown in FIG. 14, the signal sig_E (t6) is the signal at the change point, so the second test vector generation unit 323 inverts the signal from "1" to "0". As a result, the logic circuit outputs shown in FIG. 16 are generated. In the example shown in FIG. 16, the signal sig_E (t6) cannot be changed, or data cannot be transferred correctly at t6.

If a change point of a signal is not identified (S1502—NO), the second test vector generation unit 323 randomly selects any simulation time, and inverts the signals at the asynchronous transfer points existing within the selected simulation time, so as to modify the logic circuit outputs (S1504). In the example shown in FIG. 14, the signal sig_C (t5-t6) is inverted from "1" to "0", as the signal sig_C does not have a change point. As a result, the logic circuit outputs shown in FIG. 16 are generated. In the example shown in FIG. 16, the signal sig_C (t5 to t6) is changed, or data cannot be transferred correctly between t5 and t6.

The procedures of steps S1502 to S1504 are repeated until all the change points are subjected to those procedures (S1505—YES). After all the change points are subjected to the procedures of steps S1502 to S1504 (S1505—NO), the procedures of steps S1501 to S1505 are repeated for all the asynchronous transfer points (S1506—YES). After the procedures of steps S1501 to S1505 are carried out for all the asynchronous transfer points (S1506—NO), the second test vector generation unit 323 writes the logic circuit outputs shown in FIG. 16 as the second test vector 345 into the memory 340 (S1507).

The second test vector generation unit 323 then generates the change data 346 shown in FIG. 16, and writes the change data 346 into the memory 340 (S1508).

After the procedure of step S1508 is carried out, the second test vector generation process in accordance with the third embodiment of the present invention is completed.

In accordance with the third embodiment of the present invention, a signal of an asynchronous transfer point at which there is not a signal change point can be forcibly changed. Accordingly, even if the quality of the first test vector is low, it is possible to generate a high-quality second test vector.

What is claimed is:
1. A testing apparatus, comprising:
an input part configured to input circuit description data in which a circuit structure of a semiconductor integrated circuit is described, a clock domain of the semiconductor integrated circuit, and a first test vector used to test a normal operation of the semiconductor integrated circuit; and
an asynchronous transfer point extraction unit configured to extract an asynchronous transfer point in the semiconductor integrated circuit in accordance with the circuit description data and the clock domain;
a simulation unit configured to calculate a logic circuit output and a first external output in the normal operation of the semiconductor integrated circuit in accordance with the circuit description data and the first test vector; and a second test vector generation unit configured to randomly select any simulation time and generate a second test vector used to test a violation of the semiconductor integrated circuit by inverting a signal of an asynchronous transfer point of the logic circuit output when the signal of the asynchronous transfer point of the logic circuit output is not identified in the selected simulation time, wherein the simulation unit calculates a second external output in the violation of the semiconductor integrated circuit in accordance with the circuit description data and the second test vector.

2. The apparatus according to claim 1, wherein the second test vector generation unit generates the second test vector by inverting a signal at a change point at which the signal of the asynchronous transfer point of the logic circuit output varies.

3. The apparatus according to claim 1, wherein:
the asynchronous transfer point extraction unit extracts a plurality of asynchronous transfer points of the semiconductor integrated circuit; and
the second test vector generation unit generates the second test vector by simultaneously inverting signals at change points at which the signals of the plurality of asynchronous transfer points of the logic circuit output vary.

4. The apparatus according to claim 1, wherein the asynchronous transfer point extraction unit adds the clock domain to a semiconductor element of the semiconductor integrated circuit, and extracts an inter-element connection formed by a pair of semiconductor elements to which different clock domains from each other are added, the an inter-element connection being extracted as the asynchronous transfer point.

5. The apparatus according to claim 4, wherein the second test vector generation unit generates the second test vector by inverting the signal at the change point at which the signal of the asynchronous transfer point of the logic circuit output varies.

6. The apparatus according to claim 4, wherein:
the asynchronous transfer point extraction unit extracts a plurality of asynchronous transfer points of the semiconductor integrated circuit; and
the second test vector generation unit generates the second test vector by simultaneously inverting signals at change points at which the signals of the plurality of asynchronous transfer points of the logic circuit output vary.

7. The apparatus according to claim 4, wherein the second test vector generation unit generates the second test vector by inverting the signal of the asynchronous transfer point of the logic circuit output when the signal of the asynchronous transfer point of the logic circuit output is a constant signal.

8. A method for causing a testing apparatus to test a semiconductor integrated circuit, comprising:
inputting circuit description data in which a circuit structure of the semiconductor integrated circuit, a clock domain of the semiconductor integrated circuit, and a first test vector used to test a normal operation of the semiconductor integrated circuit;

extracting an asynchronous transfer point in the semiconductor integrated circuit in accordance with the circuit description data and clock domain;

calculating a logic circuit output and a first external output in the normal operation of the semiconductor integrated circuit in accordance with the input circuit description data and the first test vector;

randomly selecting any simulation time and generating a second test vector used to test a violation of the semiconductor integrated circuit by inverting a signal of an asynchronous transfer point of the logic circuit output when the signal of the asynchronous transfer point of the logic circuit output is not identified in the selected simulation time; and calculating a second external output in the violation of the semiconductor integrated circuit in accordance with the circuit description data and the second test vector, wherein the method for causing the testing apparatus to test the semiconductor integrated circuit is stored in a memory and is executed by a simulator.

9. The method according to claim 8, wherein in generating a second test vector, the second test vector is generated by inverting a signal at a change point at which the signal of the asynchronous transfer point of the logic circuit output varies.

10. The method according to claim 8, wherein:
in extracting the asynchronous transfer point, a plurality of asynchronous transfer points of the semiconductor integrated circuit are extracted; and
in generating the second test vector, the second test vector is generated by simultaneously inverting signals at change points at which the signals of the plurality of asynchronous transfer points of the logic circuit output vary.

11. The method according to claim 8, wherein in extracting the asynchronous transfer point, the clock domain is added to a semiconductor element of the semiconductor integrated circuit, and an inter-element connection formed by a pair of semiconductor elements to which different clock domains from each other are added is extracted as the asynchronous transfer point.

12. The method according to claim 11, wherein in generating the second test vector, the second test vector is generated by inverting the signal at the change point at which the signal of the asynchronous transfer point of the logic circuit output varies.

13. The method according to claim 11, wherein:
in extracting the asynchronous transfer point, a plurality of asynchronous transfer points of the semiconductor integrated circuit are extracted; and
in generating the second test vector, the second test vector is generated by simultaneously inverting signals at change points at which the signals of the plurality of asynchronous transfer points of the logic circuit output vary.

14. The method according to claim 11, wherein in generating the second test vector, the second test vector is generated by inverting the signal of the asynchronous transfer point of the logic circuit output when the signal of the asynchronous transfer point of the logic circuit output is a constant signal.

* * * * *